United States Patent
Hsu et al.

(10) Patent No.: US 9,959,928 B1
(45) Date of Patent: May 1, 2018

(54) ITERATIVE METHOD AND APPARATUS TO PROGRAM A PROGRAMMABLE RESISTANCE MEMORY ELEMENT USING STABILIZING PULSES

(71) Applicant: MACRONIX INTERNATIONAL CO., LTD., Hsinchu (TW)

(72) Inventors: Kai-Chieh Hsu, Taoyuan (TW); Feng-Min Lee, Hsinchu (TW); Yu-Yu Lin, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 3 days.

(21) Appl. No.: 15/377,071

(22) Filed: Dec. 13, 2016

(51) Int. Cl.
*G11C 11/00* (2006.01)
*G11C 13/00* (2006.01)

(52) U.S. Cl.
CPC ...... *G11C 13/0064* (2013.01); *G11C 13/0007* (2013.01); *G11C 13/0069* (2013.01); *G11C 2013/0092* (2013.01)

(58) Field of Classification Search
CPC ............ G11C 13/0064; G11C 13/0007; G11C 13/0069; G11C 2013/0092
See application file for complete search history.

(56) References Cited

U.S. PATENT DOCUMENTS

| | | |
|---|---|---|
| 5,077,691 A | 12/1991 | Haddad et al. |
| 5,126,973 A | 6/1992 | Gallia et al. |
| 5,325,334 A | 6/1994 | Roh et al. |
| 5,537,665 A | 7/1996 | Patel et al. |
| 5,590,085 A | 12/1996 | Yuh et al. |
| 5,621,691 A | 4/1997 | Park |
| 5,732,030 A | 3/1998 | Dorney |
| 5,745,410 A | 4/1998 | Yiu et al. |
| 5,812,466 A | 9/1998 | Lee et al. |
| 5,953,270 A | 9/1999 | Kim |
| 5,959,904 A | 9/1999 | Oh |

(Continued)

OTHER PUBLICATIONS

Baek, I.G., "Highly Scalable Non-volatile Resistive Memory using Simple Binary Oxide Driven by Asymmetric Unipola Voltage Pulses," IEEE IEDM Dec. 13-15, 2004, 4 pages.

(Continued)

*Primary Examiner* — Richard Elms
*Assistant Examiner* — Jerome Leboeuf
(74) *Attorney, Agent, or Firm* — Haynes Beffel & Wolfeld LLP

(57) ABSTRACT

A method to program a programmable resistance memory cell includes performing one or more iterations until a verifying passes. The iterations include a) applying a programming pulse to the memory cell, and, b) after applying the programming pulse, verifying if the resistance of the memory cell is in a target resistance range. After an iteration of the one or more iterations in which the verifying passes, c) a stabilizing pulse with a polarity the same as the programming pulse is applied to the memory cell. After applying the stabilizing pulse, a second verifying determines if the resistance of the programmable element is in the target resistance range. Iterations comprising steps a), b), c), and d) are performed until the second verifying passes. Methods and apparatus are described to program a plurality of such cells, including applying a stabilizing pulse of the same polarity after programming.

12 Claims, 9 Drawing Sheets

(56) References Cited

U.S. PATENT DOCUMENTS

| | | | |
|---|---|---|---|
| 5,999,463 A | 12/1999 | Park et al. | |
| 6,002,620 A | 12/1999 | Tran et al. | |
| 6,094,384 A | 7/2000 | Ka | |
| 6,115,300 A | 9/2000 | Massoumi et al. | |
| 6,141,268 A | 10/2000 | Chen et al. | |
| 6,205,515 B1 | 3/2001 | Huang | |
| 6,317,355 B1 | 11/2001 | Kang | |
| 6,337,816 B1 | 1/2002 | Park et al. | |
| 6,343,037 B1 | 1/2002 | Park et al. | |
| 6,445,626 B1 | 9/2002 | Hsu et al. | |
| 6,490,208 B2 | 12/2002 | Yoon | |
| 6,496,425 B1 | 12/2002 | Abedifard et al. | |
| 6,603,690 B1 | 8/2003 | Chen et al. | |
| 6,665,221 B2 | 12/2003 | Abedifard et al. | |
| 6,671,214 B2 | 12/2003 | Abedifard et al. | |
| 6,674,676 B1 | 1/2004 | Hsu et al. | |
| 6,678,191 B2 | 1/2004 | Lee et al. | |
| 6,849,905 B2 | 2/2005 | Ilkbahar et al. | |
| 6,915,467 B2 | 7/2005 | Pilo | |
| 6,966,012 B1 | 11/2005 | Gandhi | |
| 7,061,790 B2 | 6/2006 | Morimoto et al. | |
| 7,064,990 B1 | 6/2006 | Dawson et al. | |
| 7,134,057 B1 | 11/2006 | Kaushik et al. | |
| 7,251,173 B2 | 7/2007 | Lunde et al. | |
| 7,570,536 B2 | 8/2009 | Chi | |
| 7,738,308 B2 | 6/2010 | Afghahi et al. | |
| 7,760,553 B2 | 7/2010 | Jang | |
| 7,943,920 B2 | 5/2011 | Chien et al. | |
| 7,978,496 B2 | 7/2011 | Kumar et al. | |
| 8,134,139 B2 | 3/2012 | Lin et al. | |
| 8,279,656 B2 | 10/2012 | Chien et al. | |
| 8,355,271 B2 | 1/2013 | Rabkin et al. | |
| 8,446,758 B2 | 5/2013 | Chen | |
| 8,902,629 B2 | 12/2014 | Kawai et al. | |
| 8,962,466 B2 | 2/2015 | Lee et al. | |
| 9,165,671 B2 | 10/2015 | Lee | |
| 9,165,680 B2 | 10/2015 | Hung et al. | |
| 9,208,874 B2 | 12/2015 | Lee et al. | |
| 9,251,893 B2 | 2/2016 | Chung | |
| 9,514,815 B1 | 11/2016 | Lin et al. | |
| 9,646,687 B2 * | 5/2017 | Kwon | G11C 13/0033 |
| 2002/0142609 A1 | 10/2002 | Hart et al. | |
| 2003/0031958 A1 | 2/2003 | Tohge et al. | |
| 2004/0123181 A1 | 6/2004 | Moon et al. | |
| 2005/0247921 A1 | 11/2005 | Lee et al. | |
| 2007/0105372 A1 | 5/2007 | Geusic et al. | |
| 2009/0180340 A1 | 7/2009 | Song et al. | |
| 2009/0184396 A1 | 7/2009 | Kim et al. | |
| 2009/0219740 A1 * | 9/2009 | Nagashima | G11C 5/02 365/51 |
| 2010/0027326 A1 | 2/2010 | Kim et al. | |
| 2010/0059808 A1 | 3/2010 | Zheng et al. | |
| 2010/0107004 A1 | 4/2010 | Bottelli et al. | |
| 2010/0308298 A1 | 12/2010 | Ninomiya et al. | |
| 2011/0002155 A1 | 1/2011 | Arita et al. | |
| 2011/0140069 A1 | 6/2011 | Inoue | |
| 2011/0180775 A1 | 7/2011 | Lin et al. | |
| 2012/0075909 A1 | 3/2012 | Nakura et al. | |
| 2012/0075943 A1 | 3/2012 | Chen et al. | |
| 2012/0097915 A1 | 4/2012 | Mikawa et al. | |
| 2012/0181599 A1 | 7/2012 | Lung | |
| 2012/0188813 A1 | 7/2012 | Chien et al. | |
| 2012/0280199 A1 | 11/2012 | Takagi | |
| 2013/0094275 A1 * | 4/2013 | Chen | G11C 11/00 365/148 |
| 2013/0178042 A1 | 7/2013 | Ninomiya et al. | |
| 2013/0182487 A1 | 7/2013 | Lee et al. | |
| 2013/0223131 A1 * | 8/2013 | Takagi | G11C 13/0007 365/148 |
| 2014/0104933 A1 | 4/2014 | Yamahira | |
| 2014/0131653 A1 | 5/2014 | Lee et al. | |
| 2014/0233299 A1 | 8/2014 | Lan et al. | |
| 2015/0023094 A1 | 1/2015 | Lam et al. | |
| 2015/0043274 A1 | 2/2015 | Liu et al. | |
| 2015/0155037 A1 | 6/2015 | Lee et al. | |
| 2015/0270009 A1 | 9/2015 | Lee | |
| 2016/0365144 A1 * | 12/2016 | Ueki | G11C 13/0069 |

OTHER PUBLICATIONS

Chen, An, et al., "Non-Volatile Resistive Switching for Advanced Memory Applications," IEEE IEDM, Dec. 5-7, 2005, 4 pages.

Degraeve et al., "Quantitative model for post-program instabilities in filamentary RRAM," 2016 IEEE International Reliability Physics Symposium (IRPS), Pasadena, CA, Apr. 17-21, 2016, pp. 6C-1-1-6C-1-7.

Fantini et al., "Intrinsic program instability in HfO2 RRAM and consequences on program algorithms," 2015 IEEE International Electron Devices Meeting (IEDM), Washington, DC, Dec. 7-9, 2015, pp. 7.5.1-7.5.4.

Kozicki, Michael N., et al., "A Low-Power Nonvolatile Switching Element Based on Copper-Tungsten Oxide Solid Electrolyte," IEEE Trans. on Nanotechnology, V. 5, No. 5, Sep. 2006, 10 pages.

* cited by examiner

○ = Oxygen vacancy

ITERATIVE METHOD AND APPARATUS TO PROGRAM A PROGRAMMABLE RESISTANCE MEMORY ELEMENT USING STABILIZING PULSES

BACKGROUND

Field of the Technology

The present technology relates to a method to improve data state retention for a memory cell including a programmable element having programmable resistance.

Description of Related Art

Programmable resistance nonvolatile memory utilizes a memory material, such as a metal oxide material, which changes resistance between two or more stable resistance ranges by application of electrical pulses at levels suitable for implementation in integrated circuits. The two or more resistance ranges correspond to data states. Access lines such as bit lines and word lines coupled to the memory cells are connected to circuitry to perform programming operations, such as SET and RESET operations, which switch the programmable element between lower and higher resistance ranges.

A known way to program such a cell is by incremental step pulse programming (ISPP), as shown in FIG. 1. To perform a RESET operation, for example, a programming pulse (RESET1) is applied, followed by a verify step to determine if the resistance of the programmable element is in the target resistance range. If it is not, a second programming pulse (RESET2) with an increased amplitude is applied, followed by another verify step, and so on. The pulse width may be increased instead of, or as well as, the amplitude. These pulse and verify iterations, which may be called a program and program verify cycle, continue until a verify step confirms that the resistance of the programmable element is within the target resistance range.

It has been found, however, that a percentage of memory cells in an array may not remain in the SET or RESET resistance range following programming and verification, and some time, which can be a relatively short time, after a verifying step, the programmable material may undergo a change causing the memory cell to have a resistance outside the target range. FIG. 2 shows a probability plot, based on a distribution a short time after all cells in the RESET (high resistance range) have been verified having a resistance above a verify level, as shown by the vertical dotted line. The plot shows a finite probability that the resistances of some cells in the RESET range after the RESET operation will change, falling below the verify level, as shown by the arrow.

A method and apparatus to improve retention of programmed data in programmable resistance memory cells would be advantageous.

SUMMARY

A method to program a programmable resistance memory cell is described. The method comprises performing one or more iterations until a verifying passes. The iterations include a) applying a programming pulse to the memory cell; and b) after applying the programming pulse, verifying if the resistance of the memory cell is in a target resistance range. After an iteration of the one or more iterations in which the verifying passes, c) a stabilizing pulse with a polarity same as the programming pulse is applied to the memory cell. For steps a) and b), at least one iteration includes changing amplitude of the programming pulse, and amplitude of the stabilizing pulse is a function of the amplitude of the stabilizing pulse in an iteration for which the verifying passes. Similarly, for steps a) and b), at least one iteration includes changing pulse width of the programming pulse, and pulse width of the stabilizing pulse is a function of the pulse width of the stabilizing pulse in an iteration for which the verifying passes.

In embodiments, after applying the stabilizing pulse, d) a second verifying step determines if the resistance of the programmable element is in the target resistance range. If the second verifying fails, iterations comprising steps a), b), c) and d) are performed until the second verifying passes. One or more additional stabilizing pulses may be applied following the stabilizing pulse. The programming method may change the resistance of the memory cell from a lower resistance range to a higher resistance range, or from a higher resistance range to a lower resistance range.

A programmable element of the memory cell may comprise a metal oxide having a programmable resistance.

A method to execute a programming operation on a plurality of memory cells in a memory array is described herein wherein a data pattern identifies memory cells to be programmed, each of the memory cells comprising a respective programmable element. The method comprises a) applying a programming pulse having a first polarity, an amplitude, and a pulse width, to memory cells identified in the data pattern; b) first verifying if resistances of the memory cells identified in the data pattern are in a target resistance range; c) applying a stabilizing pulse to the memory cells which pass said first verifying; and performing iterations comprising steps a), b) and c) on memory cells which fail the first verifying until all of the identified cells pass said first verifying.

In embodiments described herein, the method further comprises d) after applying the stabilizing pulse, second verifying if resistances of the memory cells which pass said first verifying are in a stabilized target resistance range (which can be the same as or different than the resistance range of the first verifying), and said iterations include step d), and further performing said iterations comprising steps a) through d) until all the identified memory cells pass the first and second verifying. The method may further comprise changing one or both of the amplitude and pulse width of the programming pulse in at least one of the iterations. In embodiments, an amplitude of the stabilizing pulse in at least a particular one of the iterations is a function of the amplitude of the programming pulse in the particular one of the iterations, or a pulse width of the stabilizing pulse in at least a particular one of the iterations is a function of the pulse width of the programming pulse in the particular one of the iterations. In some examples described herein, the programmable elements in the plurality of memory cells comprise a metal oxide having a programmable resistance.

In embodiments described herein, a memory comprises a plurality of memory cells, each memory cell of the plurality comprising a programmable element, and logic to perform a programming operation wherein a data pattern identifies memory cells to be programmed. The programming operation described herein includes a) applying a programming pulse having a first polarity, an amplitude, and a pulse width, to memory cells identified in the data pattern; b) first verifying if resistances of the memory cells identified in the data pattern are in a target resistance range; c) applying a stabilizing pulse to the memory cells which pass said first verifying; and performing iterations comprising steps a), b) and c) on memory cells which fail the first verifying until all of the identified cells pass said first verifying. The programming operation further comprises d) after applying the stabilizing pulse, second verifying if resistances of the memory cells which pass said first verifying are in a stabilized target resistance range, and said iterations include step d), and further performing said iterations comprising steps a) through d) until all the identified memory cells pass the first and second verifying.

In embodiments, the programming operation further comprises changing one or both of the amplitude and pulse width of the programming pulse in at least one of the iterations.

In some cases, in the programming operation an amplitude of the stabilizing pulse in at least a particular one of the iterations is a function of the amplitude of the programming pulse in the particular one of the iterations. In some cases, in the programming operation a pulse width of the stabilizing pulse in at least a particular one of the iterations is a function of the pulse width of the programming pulse in the particular one of the iterations. The programmable elements in the plurality of memory cells comprise a metal oxide having a programmable resistance.

Various other embodiments are apparent to those of ordinary skill in the art from the present document.

BRIEF DESCRIPTION OF THE DRAWINGS

FIG. 6A illustrates pulses in an iteration of a program operation like that of FIG. 6.

DETAILED DESCRIPTION

A programmable resistance memory cell can have a resistance programmed in any of two or more resistance ranges, each corresponding to a data state. For simplicity, the present application will describe a programmable element having two resistance ranges, but it will be understood that there may be more.

In order to distinguish the data state of a memory cell, a resistance window must be maintained between the low-resistance or SET range and the high-resistance or RESET range which provides a sensing margin for the memory. When the resistance of the programmable element of a memory cell changes from the SET or RESET range to an intermediate state, the width of the resistance window is reduced, and the data state of the memory cell becomes more difficult to discern.

In many memory arrays in which memory cells include a programmable element having a programmable resistance, the programmable element comprises a metal oxide such as tungsten oxide ($WO_x$), hafnium oxide ($HfO_x$), titanium oxide ($TiO_x$), tantalum oxide ($TaO_x$), titanium nitride oxide (TiNO), nickel oxide ($NiO_x$), ytterbium oxide ($YbO_x$), aluminum oxide ($AlO_x$), niobium oxide ($NbO_x$), zinc oxide ($ZnO_x$), copper oxide ($CuO_x$), vanadium oxide ($VO_x$), molybdenum oxide ($MoO_x$), ruthenium oxide ($RuO_x$), copper silicon oxide ($CuSiO_x$), silver zirconium oxide (AgZrO), aluminum nickel oxide (AlNiO), aluminum titanium oxide (AlTiO), gadolinium oxide ($GdO_x$), gallium oxide ($GaO_x$), zirconium oxide ($ZrO_x$), chromium doped $SrZrO_3$, chromium doped $SrTiO_3$, PCMO, or LaCaMnO, etc. In some cases, the programmable element of a memory cell can be a semiconductor oxide, such at silicon oxide ($SiO_x$).

Figure 1:
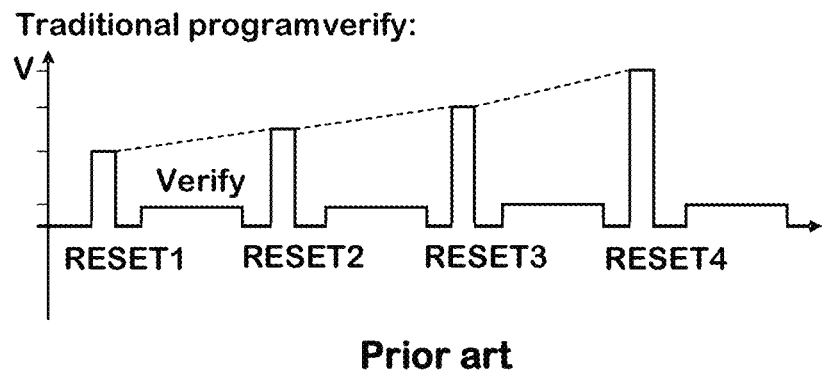
FIG. 1 illustrates a conventional method of ISPP programming used to program a memory cell including a programmable element with programmable resistance.
Figure 2:
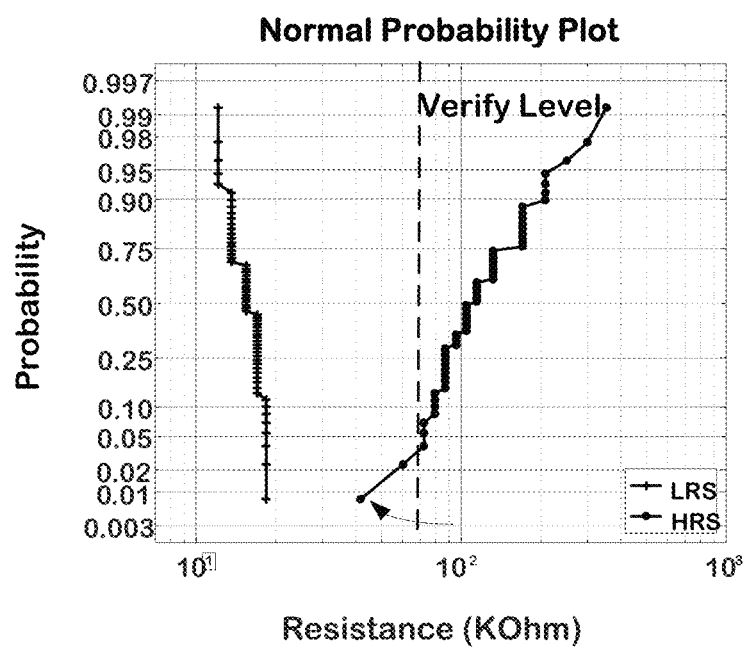
FIG. 2 shows a distribution of memory cells in the SET and RESET ranges in which cells in the RESET ranges have shown a change in resistance following programming and verification.
Figures 3A, 3B:
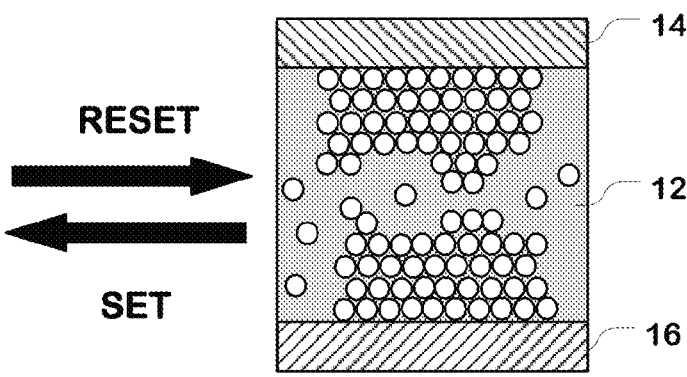
FIGS. 3a, 3b, and 3c illustrate the formation and disruption of a conductive filament in a metal oxide in the SET and RESET states, and partial reformation of a filament due to ion diffusion.
Figure 3C:
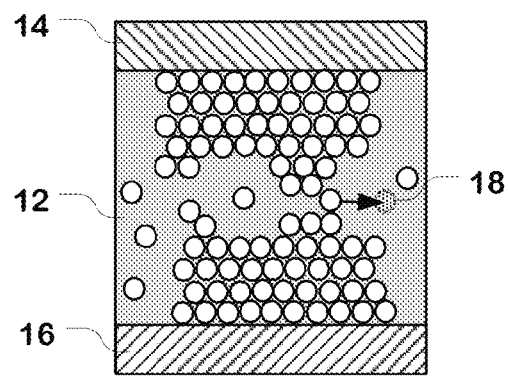

FIGS. 3a, 3b, and 3c each show a memory cell, including a programmable element provided by a layer 12 of a metal oxide, which is disposed between a top electrode 14 and a bottom electrode 16. In some types of materials, it is believed that the switching mechanism between the SET and RESET ranges relies on the formation and disruption of a conductive filament through metal oxide layer 12. The conductive filament, which is formed in the SET range shown in FIG. 3a, is believed to be made up of oxygen vacancies in some programmable resistance materials. It is believed that a RESET pulse tends to drive oxygen ions toward the filament, causing them to recombine with the oxygen vacancies, rupturing the conductive filament and switching the cell to the higher-resistance RESET range, as in FIG. 3b. A SET pulse tends to drive oxygen ions away from the filament, creating ion vacancies and reforming the filament to switch the cell into a lower-resistance SET range.

It has been found that some percentage of programmed cells (in this discussion programming will be used to describe moving a programmable element either from higher to lower resistance or from lower to higher resistance; i.e. either SET or RESET), following programming and verification, spontaneously change to a resistance within the window relied upon for a sensing margin, usually within a few seconds after the verifying step of a programming operation. This change can cause sensing errors. To avoid sensing errors caused by this change, the device must be designed to work with more narrow sensing margins, which can be expensive or impractical.

It is believed this change is due to ion diffusion in some memory materials. For example, as shown in FIG. 3c, following a RESET operation, which has ruptured the filament, after some seconds, oxygen ions 18 may diffuse away from the filament region, leaving behind oxygen vacancies and at least partially reforming the conductive filament. Conversely, following a SET operation, in which a conductive filament of oxygen vacancies is formed, oxygen ions may diffuse toward the filament region, recombining with oxygen vacancies, and at least partially disrupting the filament.

In embodiments described herein, application of a stabilizing pulse following verification that the programmable element has resistance in a target resistance range has been shown to improve stability, reducing spontaneous changes of resistance following programming that can cause sensing errors. It may be that the stabilizing pulse, which has the same polarity as the programming pulse, serves to arrest or limit ion diffusion.

Figure 4:
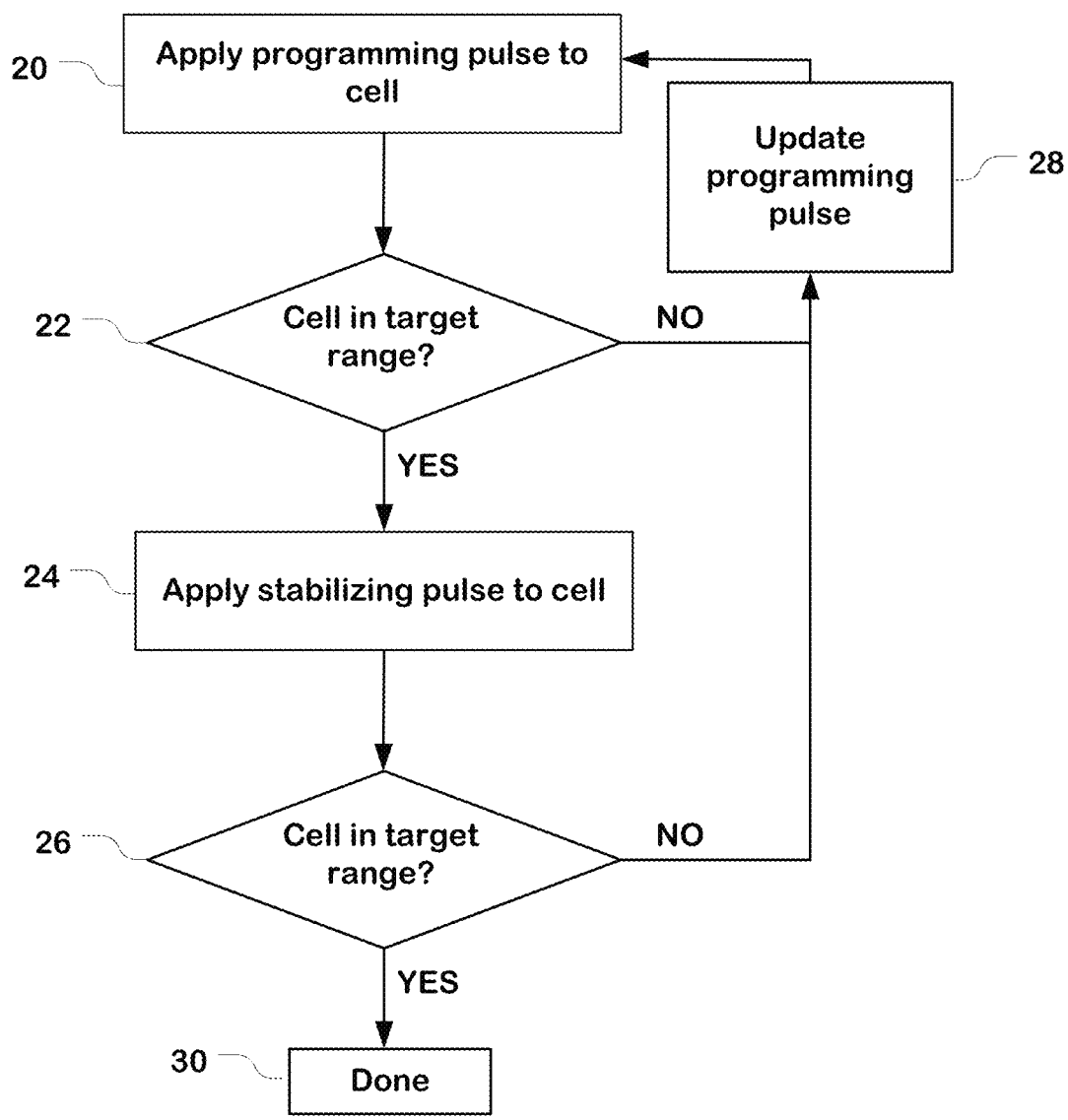
FIG. 4 is a flow chart showing a method to program a cell and apply a stabilizing pulse following verification to improve retention.

FIG. 4 is a flow chart showing steps which may be used to program a single memory cell according to some embodiments. At step 20, a programming pulse is applied to the programmable element of the memory cell. The programming pulse may be either a SET pulse or a RESET pulse, and has a first polarity, amplitude, and pulse width. In some embodiments, the programming pulse may consist of multiple pulses.

Following application of the programming pulse, a first verification step 22 reads the cell to determine if the resistance of the programmable element is in a target resistance range. The target resistance range may have two endpoints, i.e. a high point and a low point, or the target resistance range may be any resistance above a target value limited in practical cases by the maximum resistance that the cell can achieve (in the case of a RESET operation, for example), or may be any resistance below a target value limited in practical cases by the minimum resistance that the cell can achieve (in the case of a SET operation, for example.)

If the resistance of the programmable element is not in the target resistance range (the NO branch from first verify step 22), the programming pulse is optionally changed (step 28.) As in a conventional ISPP sequence, the amplitude of the programming pulse may be incremented. Alternatively, the pulse width may be incremented, or both programming pulse amplitude and pulse width may be incremented, or neither. One or both of the amplitude and the pulse width may be incremented between every programming pulse, or at some other interval, or may be decremented, or may be unchanged. Updating the programming pulse may include any or all of these changes or lack of change. The polarity of the programming pulse remains the same.

Following the optional change of the programming pulse, at step 20 the updated programming pulse is applied to the memory cell, and the resistance of the memory cell again verified at step 22.

If, following a first or subsequent application of the programming pulse at step 20, the memory cell is found to have a resistance in the target resistance range at first verify step 22 (the YES branch) then a stabilizing pulse is applied to the memory cell at step 24. The stabilizing pulse has the same polarity as the programming pulse. In embodiments, the amplitude of the stabilizing pulse is a function of the amplitude of the programming pulse when first verify step 22 passes. Similarly, in embodiments, the pulse width of the stabilizing pulse is a function of the pulse width of the programming pulse when first verify step 22 passes. More details and examples concerning the stabilizing pulse will be provided in a later section.

Following application of the stabilizing pulse at step 24, in some embodiments a second verify step 26 reads the cell to determine if the resistance of the memory cell is in a stabilized target resistance range. If it is not (the NO branch from second verify step 26), the programming pulse can be updated at step 28, and the updated programming pulse again applied, etc.

If the resistance of the memory cell is found to be within the stabilized target resistance range at second verify step 26, i.e. if second verify 26 passes (the YES branch from second verify step 26), programming of the memory cell is complete (step 30.)

To summarize, a memory cell having a memory cell may be programmed by performing iterations including the steps of: a) applying a programming pulse having a first polarity, an amplitude, and a pulse width, to the memory cell; b) after applying the programming pulse, verifying if the resistance of the memory cell is in the target resistance range. The method includes performing one or more iterations comprising steps a) and b) until the verifying passes; and d) after the iteration in which the verifying passes, applying a stabilizing pulse to the memory cell.

As shown in FIG. 4, optionally, if the verifying at step 22 fails, the programming pulse shape can be changed by updating one or both of the amplitude and the pulse width of the programming pulse in one or more or the iterations.

Also, in some embodiments, after applying the stabilizing pulse, second verifying if the resistance of the programmable element is in a stabilized target resistance range; and, performing iterations comprising steps a) b), c), d) and e) until the second verifying passes, where the first mentioned iteration (20, 22, 28) is nested within the second mentioned iteration (20, 22, 24, 25, 28).

Figure 5:
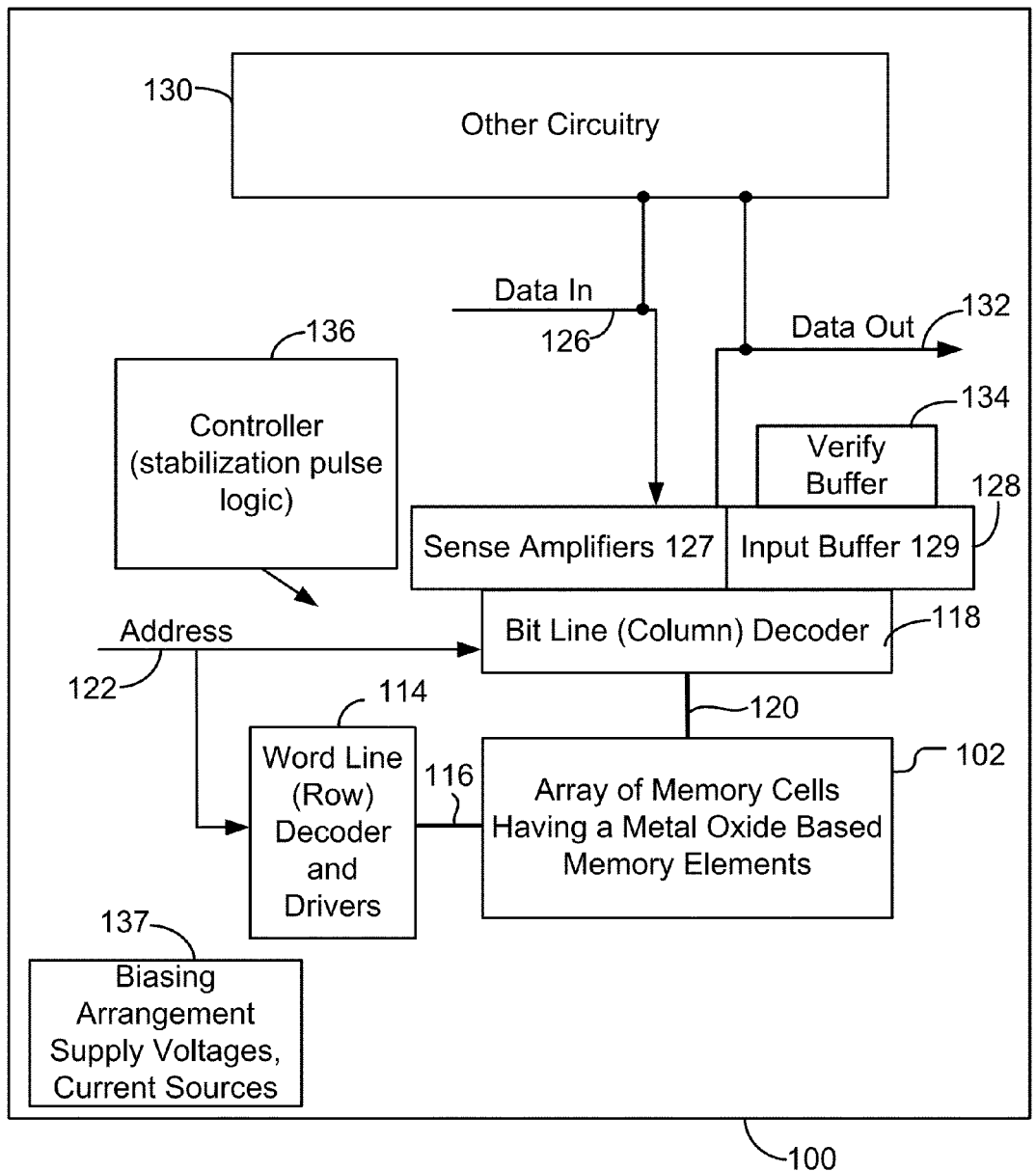
FIG. 5 is a simplified block diagram of an integrated circuit array in accordance with an embodiment.

FIG. 5 is a simplified block diagram of an integrated circuit 100 including an array of memory cells 102, and a controller 136 configured to apply stabilizing pulses as described herein. The memory cells include programmable elements comprising metal oxide. A word line decoder 114 (including word line drivers) is coupled to and in electrical communication with a plurality of word lines 116. A bit line (column) decoder 118 is in electrical communication with a plurality of bit lines 120 to read data from, and write data to, the memory cells in the array 102. Addresses are supplied on bus 122 to word line decoder 114 and bit line decoder 118. Sense amplifiers 127 and an input/output buffer 129 together make up block 128 which is coupled to bit line decoder 118. The bit line decoder 118 couples selected bit lines 120 from the array 102 to the block 128. In some embodiments, the input/output buffer 129 can be a page buffer, capable of supporting page read and page write operations. Bias arrangement supply voltages and current sources 137 are included to generate or provide biasing voltages and currents to the array 102 in support of the operation of write operations, including operations that require stabilizing pulses.

The verify buffer 134 in this example is a register or other data store used to store auxiliary data to support the application of stabilizing pulses in a programming operation, as will be explained below. In some embodiments, the registers used for storing data during the programming operations can be located elsewhere on the device, or the input/output buffer 129 can be utilized for this purpose. Data is supplied via a data-in line 126 from input/output ports on integrated circuit 100, or from other data sources.

Other circuitry 130 may be included on integrated circuit 100, such as a general purpose processor or special purpose application circuitry, or a combination of modules providing system-on-a-chip functionality supported by memory array 102. Data is supplied via a data-out line 132 from the block 128 to input/output ports on integrated circuit 100, or to other data destinations internal or external to integrated circuit 100.

A controller 136 implemented in this example, using a bias arrangement state machine, controls bias arrangement supply voltages and current sources 137, such as read voltages, program voltages such as SET and RESET, program verify voltages such as for SET and RESET, and stabilizing pulse voltages. Controller 136 may be implemented using special-purpose logic circuitry as known in the art. In alternative embodiments, controller 136 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 136.

Figure 6:
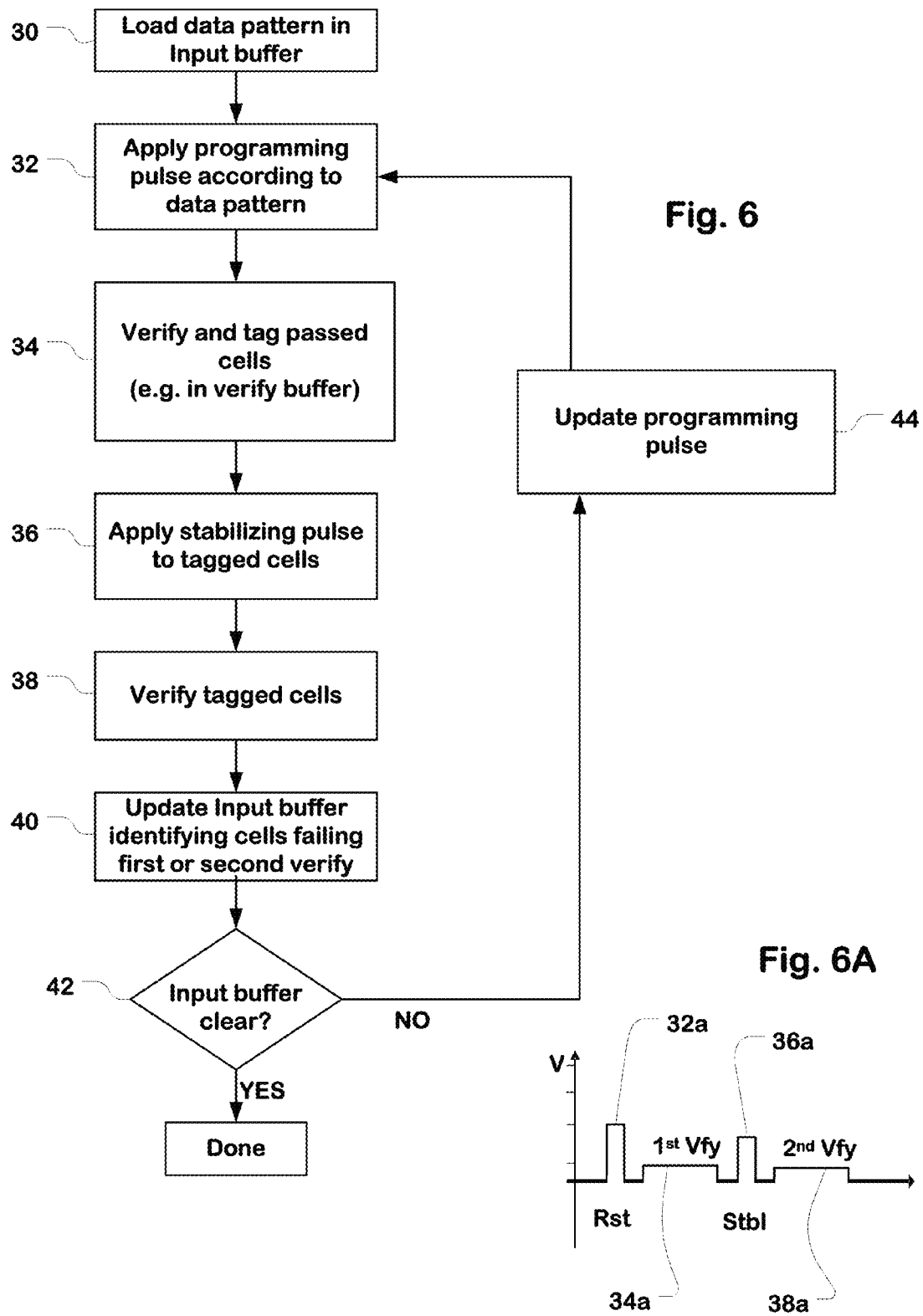
FIG. 6 is a flow chart showing a method to program a plurality of cells in a memory array like that shown in FIG. 5, including applying a stabilizing pulse following verification to improve retention.
Figure 7:
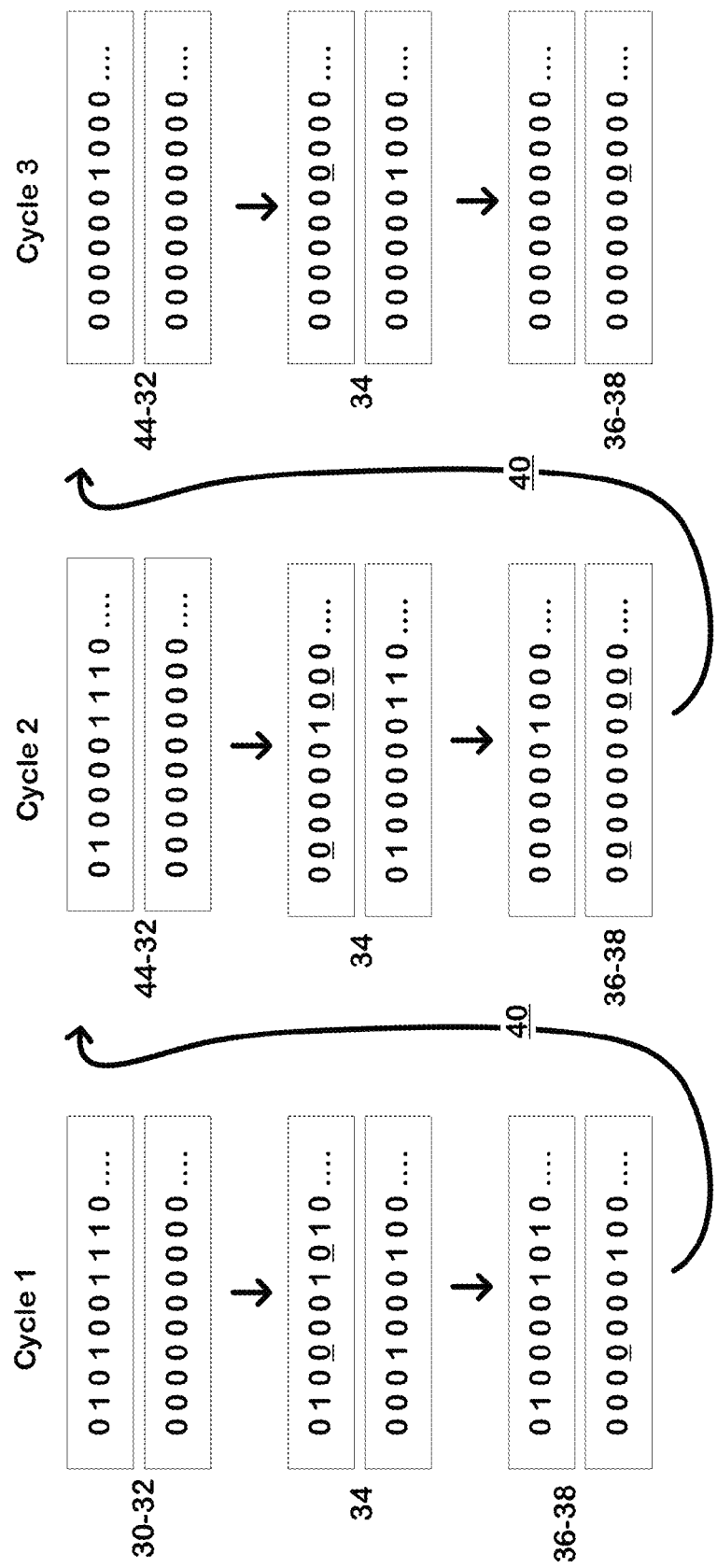
FIG. 7 shows the contents of page buffer 128 and verify buffer 134 in FIG. 5 during an example programming operation including a stabilizing pulse applied following verification.

FIG. 6 is a flow chart of logic executed by the controller and other components of the memory device of FIG. 5 to program a plurality of cells in a memory array like memory array 102 in FIG. 5, according to an embodiment. FIG. 6A shows pulses applied in an iteration of a program operation like that of FIG. 6. An example of a data set is shown in FIG. 7, as it is processed according to the flow chart in FIG. 6. This description will refer to elements of the integrated circuit 100 in FIG. 5. In this example, input buffer 129 in block 128 is configured to store a data pattern to be programmed. Each of a plurality of memory cells to be programmed is identified by a respective bit in the data pattern stored in input buffer 129 at the beginning of the programming operation. In FIG. 7, three cycles are illustrated, each cycle including three pairs of register values. The top value in each pair is the contents of the input buffer 129 at that step. The bottom value in each pair is the contents of the verify buffer 134 at that step. The reference numbers beside each pair identifies corresponding logical blocks of FIG. 6. Thus, the top register of the first pair in cycle 1 stores the data pattern from steps 30 and 32. The bottom register of the first pair in cycle 1 is clear.

At step 30 of FIG. 6, the data pattern to be written is loaded into input buffer 129, and at step 32, a programming pulse 32a is applied to the memory cells identified in input buffer 129. The programming pulse has a first polarity, or is otherwise configured to cause a selected one of an increase or a decrease in the resistance of the identified memory cells. The magnitude and shape of the programming pulse is a function of which cycle of the programming operations is being executed. In a typical ISPP operation, the magnitude of the programming pulse increases with each cycle.

At step 34, a first verifying step (pulse 34a) is performed to verify if resistances of the programmable elements of the memory cells identified in the input buffer 129 are in a target resistance range. Those cells that pass first verify step 34 are identified or tagged, for example by having their corresponding bits set in verify buffer 134. Thus, in the second pair of cycle 1, the data pattern is updated as two bits have passed, and are reset to 0 (reset bits are underlined in the figure), while the same two bits are tagged in the verify buffer 134. This logic results in identification of the memory cells to receive the stabilizing pulse in the verify buffer 134 (the two cells that pass), and in identification of cells that need to receive an additional programming pulse in the next cycle in the input buffer 129 (the input bits that did not pass the first cycle).

In step 36, a stabilizing pulse 36a is applied to the programmable elements of the tagged cells, i.e. memory cells that passed first verifying step 34. In this example the two cells tagged by having data value "1" in verify buffer 134 in the second register pair in cycle 1 receive a stabilizing pulse.

The stabilizing pulse has the same polarity as the programming pulse applied in step 32. In embodiments, the amplitude of the stabilizing pulse is a function of the amplitude of the programming pulse just applied at step 32. Similarly, in embodiments, the pulse width of the stabilizing pulse is a function of the pulse width of the programming pulse just applied at step 32.

After application of the stabilizing pulse at step 36, in some embodiments a second verifying step 38 (pulse 38a) determines whether the programmable elements of the cells that received a stabilizing pulse at step 36 have a resistance in a stabilized target resistance range. The stabilized target resistance range can be the same as or different than the target resistance range of the first verify 34. The resistance range can be established using the same verify voltage used in first verifying step 34 or a different verify voltage. If a memory cell passes this second verify step, its bit is cleared in verify data buffer 134. If it does not pass, the corresponding bit is not cleared, and remains set.

In the example shown in FIG. 7, in the third pair of register values in cycle 1, one of the two cells tagged before the stabilizing pulse of step 36 passes second verify step 38, while the other fails. This logic results in identification of the cells that failed the first verify (34) by corresponding bits in the input buffer 129, and of the cells that failed the second verify (38) by corresponding bits in the verify buffer 134. This is the end of the first cycle in the example of FIG. 7.

In step 40, input buffer 129 is updated to identify cells that failed either the first or second verify in the current iteration. In FIG. 7, the top register value in the first pair in cycle 2 is a logical OR of its contents in the third pair in the first cycle with the contents of verify buffer 134 in the third pair of the first cycle. Also, the verify buffer 134 is cleared. This logic results in identification of the cells that failed the first verify (34) or the second verify (38) by corresponding bits in the input buffer 129, and clearing of the verify buffer 134, so that it is ready for use in a next cycle of the program operation. This state is illustrated in the first pair of register values in cycle 2 of FIG. 7.

At step 42, if the input buffer 129 is not yet clear, the amplitude and/or pulse width of the programming pulse are updated at step 44 based on the cycle count, and a next programming pulse is applied at step 32. The process continues until, at step 42, no cells to be written are identified in input buffer 129 (the YES branch). In the example illustrated in FIG. 7, the second cycle results in three cells passing verify at step 34, with the same three cells being tagged for a stabilizing pulse as shown in the second register value in the second pair in cycle 2. After the stabilizing pulse in step 36 and the second verify in step 38, all three cells pass again, resulting in all zeros in the second register of the third pair in cycle 2. However, one bit remains in the input buffer 129 and the input buffer 129 is updated to the logical OR of the two registers. So, at the next cycle, the input buffer 129 identifies a single bit to be programmed. As seen in the second pair of values in cycle 3, that single bit passes verify and is tagged for a stabilizing pulse. As seen in the third pair of register values in cycle 3, that bit passes the second verify. At this stage, the input buffer 129 and the verify buffer 134 store all zeros, in the example being illustrated as shown in the third pair in the cycle 3 of FIG. 7. Therefore the data pattern program operation is completed with stabilizing pulses applied to the appropriate cells after each step of an ISPP program operation.

In an alternative method, the ISPP process can proceed until all pulses pass the program stage. Then the stabilizing pulse or pulses can be applied thereafter. When applying the stabilizing pulse after the ISPP process indicates all cells have been programmed, the magnitude and/or of the stabilizing pulse may not be a function of the magnitude and/or shape of the program pulse at which each cell passes program verify, but rather may be a constant, or may be a function of the last program pulse applied.

The logic and buffer scheme just described to write a data pattern to a plurality of memory cells in an array is just one example. Other logic and buffer arrangements can be used. Thus a memory as described herein can including logic to perform a programming operation including:

a) applying a programming pulse having a first polarity, an amplitude, and a pulse width, to memory cells identified in the buffer;

b) first verifying if resistances of the memory cells identified in the buffer are in a target resistance range;

c) applying a stabilizing pulse to the memory cells which pass said first verifying; and performing iterations comprising steps a), b) and c) on memory cells which fail the first verifying until all of the identified cells pass said first verifying.

In this embodiment, steps 30, 32, 34 and 44 are executed iteratively until all the identified cells pass verify.

Also, as shown in the embodiment of FIG. 6, the programming operation can further comprise:

d) after applying the stabilizing pulse, second verifying if resistances of the memory cells which pass said first verifying are in a stabilized target resistance range, and the iterations include step d), and further performing said iterations comprising steps a) through d) until all the identified memory cells pass the first and second verifying.

In this embodiment, the operation includes performing iterations including steps 30, 32, 34, 36, 38, 40, 42 and 44 until all the identified cells pass verify.

Figure 8:
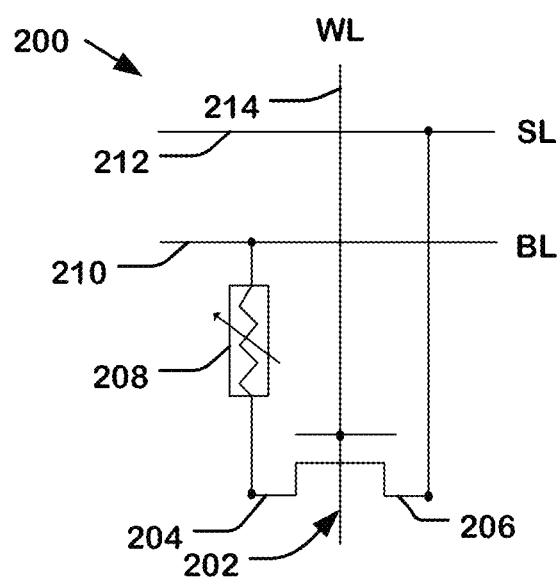
FIG. 8 is a schematic of an exemplary memory cell in accordance with an embodiment.

FIG. 8 is a schematic of a memory cell 200 in accordance with an embodiment. The memory cell 200 includes an access device, transistor 202, with a first current carrying terminal 204 (e.g. drain) and a second current carrying terminal 206 (e.g. source). The memory cell includes a programmable element 208, an electrode connected to a first access line 210, such as a bit line BL, and an electrode connected to a first current carrying terminal of the access device. A second access line 212, such as a source line SL, is connected to the second current carrying terminal 206 of the access device. In the embodiment shown in which the access device is transistor 202, the memory device further includes a third access line 214, such as a word line WL, connected to the gate of the transistor 202.

The access lines 210 and 212, and the transistor 202 can be used to apply programming (SET or RESET) pulses and stabilizing pulses to programmable element 208. For example, to apply a programming or stabilizing pulse having a first polarity, sufficient voltage may be applied, via word line 214, to the gate of transistor 202, opening the transistor channel, while a positive voltage is applied to first access line 210, and second access line 212 is held to ground. Current flows through programmable element 208 and through the channel from terminal 204 to terminal 206 of transistor 202, resulting in a programming or stabilizing pulse of a first polarity.

To produce a programming or stabilizing pulse of the opposite polarity, a voltage sufficient to open the channel of the transistor is applied via word line 214 to the gate of transistor 202, a positive voltage is applied to second access line 212, and first access line 210 is held to ground. Current flows through the channel of transistor 202, from terminal 206 to terminal 204 of transistor 202, and through programmable element 208, resulting in a programming or stabilizing pulse of a second polarity opposite the first. Other arrangements, for example using different types of access devices, may readily be envisioned by those skilled in the art.

In an exemplary memory array, each memory cell included a programmable element comprising $WO_x$ and a transistor serving as an access device. In this example, the target resistance range for a memory cell including a programmable element in the SET range was less than 19 kOhm, while the target resistance range for a memory cell including a programmable element in the RESET range was greater than 66 kOhm.

To apply the first programming pulse to place such a memory cell in a SET range, a voltage of 4.0 V was applied to the gate of the transistor via a word line. A voltage of 4.0 V was greater than the threshold voltage and thus allowed current to flow in the channel of the transistor. Source line voltage of 2.5 V was applied to one terminal of the transistor, for example the source, while the drain was held to ground; source voltage was higher than drain voltage. The pulse width was 500 nsec.

A SET verify step was performed. If, following application of the first programming pulse, the resistance of the memory cell including the programmable element was found not to be in the target resistance range (less than 19 kOhm), in this example the amplitude of the voltage applied to the source was increased by 0.1 V, to 2.6 V. The gate voltage remained at 4.0 V and the drain of the transistor was held to ground. The pulse width was unchanged. After application of the next programming pulse, SET verification was again performed. If the cell again failed verification, the amplitude of the source voltage was again increased by 0.1 V. In this example, the pulse width was unchanged.

To apply the first programming pulse to place such a memory cell in a RESET state, a voltage of 2.5 V was applied to the gate of the transistor via a word line. A voltage of 2.5 V was greater than the threshold voltage and thus allowed current to flow in the channel of the transistor. Bit line voltage of 2.0 V was applied to one terminal of the transistor, for example the drain, while the source was held to ground. Note drain voltage was higher than source voltage, so the current flow for the RESET operation is opposite what it was for the SET operation, and the programming pulse has opposite polarity. The pulse width may be, for example, 1000 nsec.

A RESET verify step was performed. If, following application of the first programming pulse, the resistance of the programmable element was found not to be in the target resistance range (greater than 66 kOhm), in this example the amplitude of the voltage applied to the drain was increased by 0.1 V, to 2.1 V. The gate voltage remained at 2.5 V and the source of the transistor was held to ground. The pulse width was unchanged. After application of the next programming pulse, verification was again performed. If the cell again failed RESET verification, the amplitude of the source voltage was again increased by 0.1 V. In this example, the pulse width was unchanged.

In the exemplary cell, the stabilizing pulse conditions are the same as those of the programming pulse that passed verify; i.e. the stabilizing pulse has the same amplitude and pulse width as the programming pulse that passed the first verify.

An example has been provided for completeness and specificity. In other embodiments, many aspects may be changed: Other materials may be used for the programmable element. A different type of access device, other than a transistor, or a combination of devices, may be used. Different voltages may be applied, and in different arrangements. The amplitude of the programming pulse may or may not be increased or decreased, and, if increased or decreased, may not be increased or decreased by a uniform amount, or on every iteration. Similarly, the pulse width of the programming pulse may or may not be increased or decreased, and, if increased or decreased, may not be increased or decreased by a uniform amount, or on every iteration.

As described, a stabilizing pulse is applied once a memory cell passes a verification step finding the resistance of the programmable element to be in a target resistance range. In embodiments of the present technology, the amplitude of the stabilizing pulse is a function of the amplitude of the programming pulse when the cell passes first verification, i.e. verification of the programming pulse. Similarly, in embodiments, the pulse width of the stabilizing pulse is a function of the pulse width of the programming pulse when the cell passes first verification. The stabilizing pulse has the same polarity as the programming pulse.

In some embodiments, if the resistance of the programmable element of the memory cell is in a target resistance range following application of only one programming pulse (for example, if the memory cell passes first verifying step 22 in FIG. 4 on the first time), the amplitude of the stabilizing pulse may be the same as or greater than, for example 100-110 percent of, the amplitude of the applied programming pulse. Similarly, if the resistance of the programmable element of the memory cell is in a target resistance range after application of only one programming pulse, the pulse width of the stabilizing pulse is the same as or greater, for example 100-110% of, than the pulse width of the applied programming pulse.

In these embodiments, if the resistance of the programmable element of the memory cell is not in a target resistance range in the first verifying step 22 after application of only one programming pulse (step 20), and reaches the target resistance range only after the second or later programming pulse is applied at step 20, the amplitude of the stabilizing pulse may be a percentage of the programming pulse when the cell passed first verifying step 22. The amplitude of the stabilizing pulse may be, for example, 80-120 percent, or 90-110 percent of the amplitude of the programming pulse when the cell passes, that is the amplitude of the final programming pulse before a cell passes first verifying step 22. Similarly, the pulse width of the stabilizing pulse may be, for example, 80-120 percent, or 90-110 percent of the pulse width of the programming pulse when the cell passes, that is the pulse width of the final programming pulse before a cell passes first verifying step 22.

In either case, the stabilizing pulse has the same polarity as the programming pulse that it follows, and acts to change resistance of the memory cell in the same direction as the programming pulse (i.e. both having a polarity tending to increase resistance by decreasing a concentration of oxygen vacancies in the programmable element, or both having a polarity tending to decrease resistance by increasing a concentration of oxygen vacancies in the programmable element).

In other embodiments, other relationships between amplitude and/or pulse width of the stabilizing pulse and the latest applied programming pulse when the memory cell to be programmed passes first verifying step 22 may apply.

Use of the methods described herein has been found to reduce spontaneous switching of the resistance of a memory element following a SET or RESET operation, which usually occurs within seconds following programming.

Figure 9A:
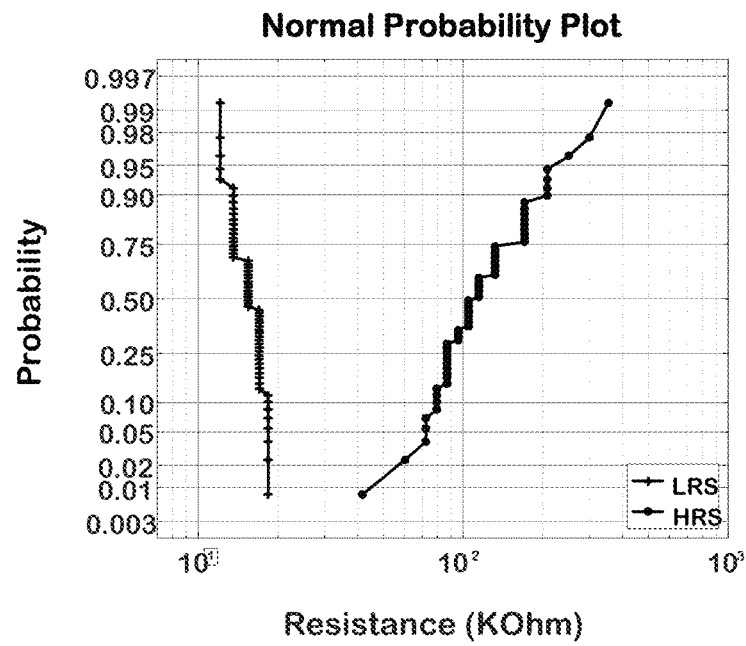
FIGS. 9a and 9b show SET and RESET distributions showing an improved window between the distributions achieved by applying a stabilizing pulse according to an embodiment.
Figure 9B:
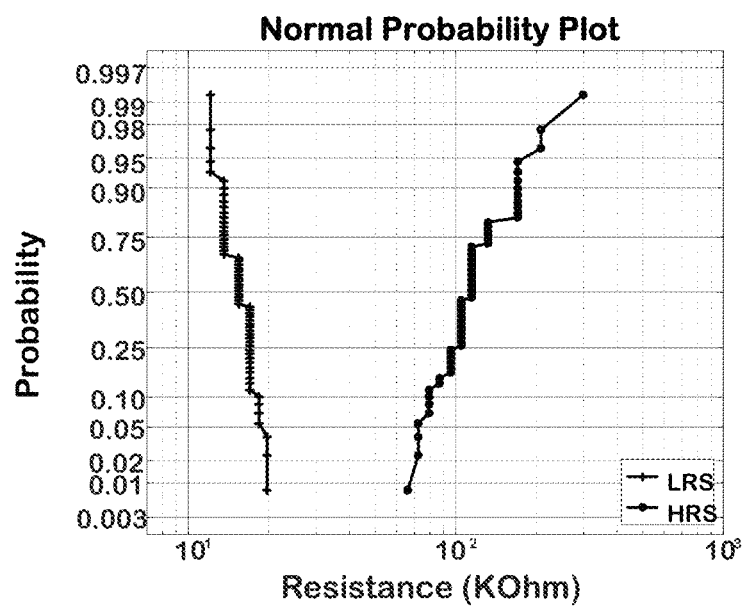

FIG. 9*a* is a normal probability plot based on a distribution of memory cells programmed using a conventional ISPP method with no stabilizing pulse applied after verification, and FIG. 9*b* is normal probability plot based on a distribution of memory cells with a stabilizing pulse applied after verification, according to methods and apparatus described herein. Each memory cell included a programmable element comprising $WO_x$ and a transistor serving as an access device. In this example the programmed cells were subjected to a RESET operation.

In FIG. 9*a*, the sensing margin window between the SET and RESET distributions is 21 kOhm wide, while in FIG. 9*b*, the sensing margin window between the SET and RESET distributions is 47 kOhm wide. It is advantageous to maximize the window between the SET and RESET distributions.

Figure 10A:
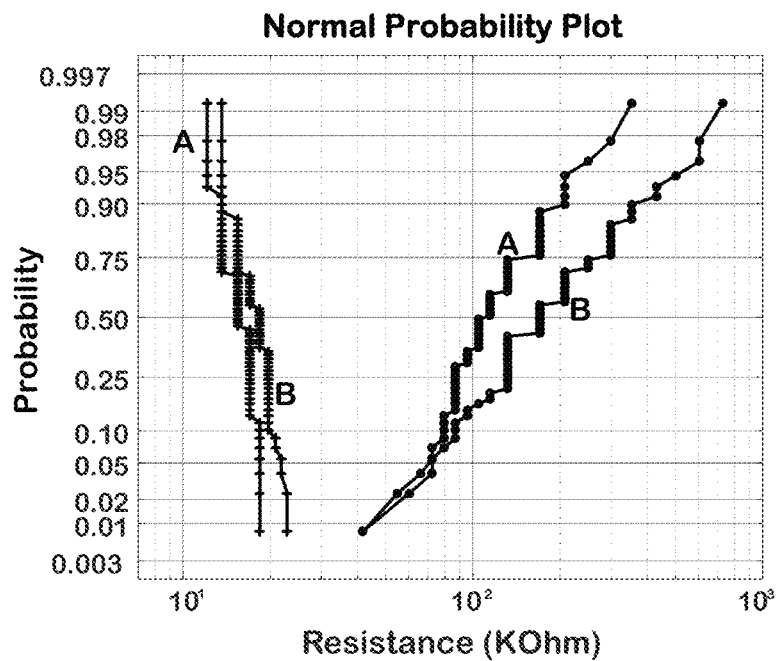
FIGS. 10a and 10b show SET and RESET distributions before and after baking using ISPP programming, and programming with a stabilizing pulse applied following verification, respectively.
Figure 10B:
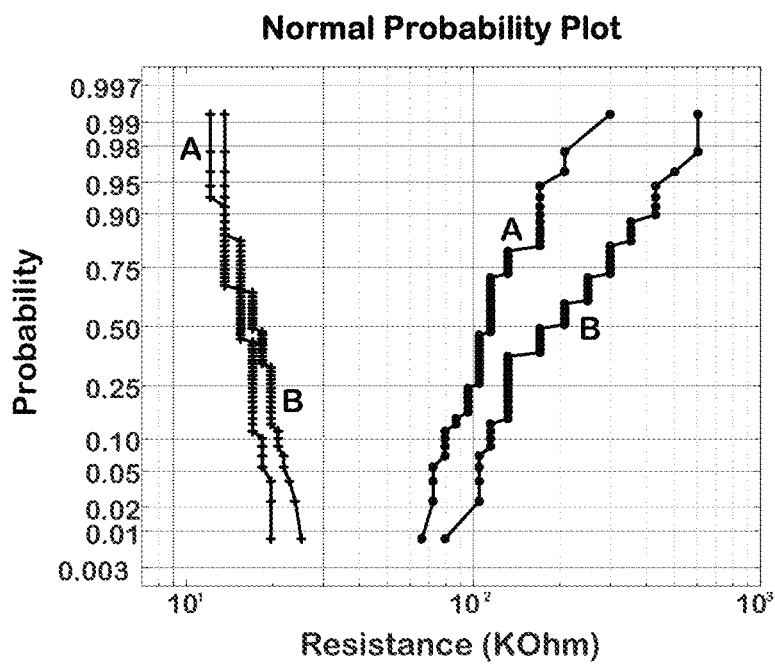

It has been found that applying a stabilizing pulse following a RESET operation improves retention of the high resistance range. Baking programmed cells simulates conditions under use. A plurality of ReRAM cells including a programmable element comprising metal oxide were programmed by a conventional ISPP approach without a stabilizing pulse. FIG. 10*a* is a probability plot based on SET and RESET distributions of the plurality of the cells before (A) and after (B) baking at 210 degrees C. for 150 minutes. FIG. 10*b* is a probability plot based on SET and RESET distributions of a plurality of similar ReRAM cells before (A) and after (B) baking at the same conditions where a stabilizing pulse as described herein has been applied in both SET and RESET operations. It can be seen that the improved window between the SET and RESET distributions persists and even improves with baking. Each memory cell included a programmable element comprising $WO_x$ and a transistor serving as an access device.

In some embodiments, the stabilizing pulse, as applied when a cell passes first verification step 22 in FIG. 4 or first verification step 34 in FIG. 6, for example, may comprise multiple pulses, all having the same polarity. Though any combination of pulses may be used for the stabilizing pulse, in embodiments there may be up to five pulses, which may be evenly spaced, though other spacings might be used. In some embodiments, all pulses making up a stabilizing pulse will have the same amplitude and pulse width, though in other embodiments amplitude and pulse width may be varied. The amplitude and pulse width of the multiple pulses making up the stabilizing pulse may each be as described earlier for a single stabilizing pulse: 100-110 percent of the amplitude and/or pulse width of the programming pulse if the resistance of the programmable element of the memory cell achieves a target resistance range after only one programming pulse; and 80-120 percent, or 90-110 percent, of the amplitude and/or pulse width of the programming pulse when the cell passed the first verify step 22 of FIG. 4 if the resistance of the programmable element of the memory cell achieves a target resistance range after a second or later programming pulse in a particular attempt to program the cell.

In embodiments described, a stabilizing pulse is applied following verification. In other embodiments, a stabilizing pulse having the same polarity as the programming pulse can be applied following the programming pulse, with no verification after the stabilizing pulse.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method to execute a programming operation on a plurality of memory cells in a memory array wherein a data pattern identifies memory cells to be programmed, each of the memory cells comprising a respective programmable element, the method comprising:
    loading data into an input buffer coupled to the memory array, the data in the input buffer setting the data pattern for programming a page of memory cells, and executing an iterative program operation to the page of memory cells until the data in the input buffer is programmed, iterations of the iterative program operation including:
    applying a programming pulse having a first polarity, an amplitude, and a pulse width, to memory cells identified in the data pattern;
    first verifying if resistances of the memory cells identified in the data pattern are in a target resistance range;
    tagging memory cells in the page which pass the first verifying in a verify buffer coupled to the memory array;
    applying a stabilizing pulse having the first polarity to memory cells in the page tagged in the verify buffer;
    after applying the stabilizing pulse, second verifying if resistances of the memory cells in the page tagged in the verify buffer are in the target resistance range; and
    updating the data pattern in the input buffer to indicate memory cells in the page which failed the first verifying or the second verifying.

2. The method of claim 1, wherein the method to program the memory cell changes resistance of the memory cell from a lower resistance range to a higher resistance range.

3. The method of claim 1 further comprising, changing one or both of the amplitude and pulse width of the programming pulse in at least one of the iterations.

4. The method of claim 1 further comprising, changing the amplitude of the programming pulse in at least a particular one of the iterations, and changing an amplitude of the stabilizing pulse in at least the particular one of the iterations as a function of the amplitude of the programming pulse in the particular one of the iterations.

5. The method of claim 1 further comprising, changing the pulse width of the programming pulse in at least a particular one of the iterations, and changing a pulse width of the stabilizing pulse in at least the particular one of the iterations as a function of the pulse width of the programming pulse in the particular one of the iterations.

6. The method of claim 1 wherein the programmable elements in the plurality of memory cells comprise a metal oxide having a programmable resistance.

7. A memory, comprising:
    a plurality of memory cells, each memory cell of the plurality comprising a programmable element;
    a page buffer coupled to the plurality of memory cells, the page buffer configured to store data to be programmed in the plurality of memory cells and setting a data pattern;
    a verify buffer coupled to the plurality of memory cells;
    logic to perform an iterative programming operation to a page of memory cells in the plurality of memory cells until the data in the page buffer is programmed, iterations of the iterative program operation including:
    applying a programming pulse having a first polarity, an amplitude, and a pulse width, to memory cells identified in the data pattern in the page buffer;
    first verifying if resistances of the memory cells identified in the data pattern are in a target resistance range;
    tagging memory cells in the page which pass the first verifying in the verify buffer;
    applying a stabilizing pulse having the first polarity to the memory cells in the page tagged in the verify buffer;
    after applying the stabilizing pulse, second verifying if resistances of the memory cells in the page tagged in the verify buffer are in the target resistance range; and
    updating the data pattern in the page buffer to indicate memory cells in the page which failed the first verifying or the second verifying.

8. The memory of claim 7, the programming operation further comprising changing one or both of the amplitude and pulse width of the programming pulse in at least one of the iterations.

9. The memory of claim 7, wherein the programming operation further comprises changing the amplitude of the programming pulse in at least a particular one of the iterations, and changing an amplitude of the stabilizing pulse in the particular one of the iterations as a function of the amplitude of the programming pulse in the particular one of the iterations.

10. The memory of claim 7, wherein the programming operation further comprises changing the pulse width of the programming pulse in at least a particular one of the iterations, and changing a pulse width of the stabilizing pulse in at least a particular one of the iterations as a function of the pulse width of the programming pulse in the particular one of the iterations.

11. The memory of claim 7 wherein the programmable elements in the plurality of memory cells comprise a metal oxide having a programmable resistance.

12. The memory of claim 7, wherein the programming pulse in the iterations changes resistance of the memory cell from a lower resistance range to a higher resistance range.

* * * * *